(12) United States Patent
Kamali

(10) Patent No.: US 7,877,022 B2
(45) Date of Patent: Jan. 25, 2011

(54) CIRCUITS AND METHODS OF THERMAL GAIN COMPENSATION

(76) Inventor: Walid Kamali, 5854 Pro Dr., Norcross, GA (US) 30092

( * ) Notice: Subject to any disclaimer, the term of this patent is extended or adjusted under 35 U.S.C. 154(b) by 1236 days.

(21) Appl. No.: 11/482,440

(22) Filed: Jul. 7, 2006

(65) Prior Publication Data

US 2008/0008266 A1   Jan. 10, 2008

(51) Int. Cl.
  *H04B 10/04* (2006.01)

(52) U.S. Cl. ........................... 398/202; 398/208

(58) Field of Classification Search ................. 398/202, 398/208, 210
See application file for complete search history.

(56) References Cited

U.S. PATENT DOCUMENTS

| 4,135,132 A | * | 1/1979 | Tafjord | 333/167 |
| 5,239,402 A | | 8/1993 | Little | 398/202 |
| 5,770,974 A | | 6/1998 | Vogt et al. | 330/327 |

* cited by examiner

*Primary Examiner*—Leslie Pascal
(74) *Attorney, Agent, or Firm*—Tarolli, Sundheim, Covell & Tummino LLP

(57) ABSTRACT

Disclosed herein are circuits and methods for reducing a thermally dependent gain swing. Exemplary embodiments include a resonant notch filter in parallel with a thermistor.

16 Claims, 5 Drawing Sheets

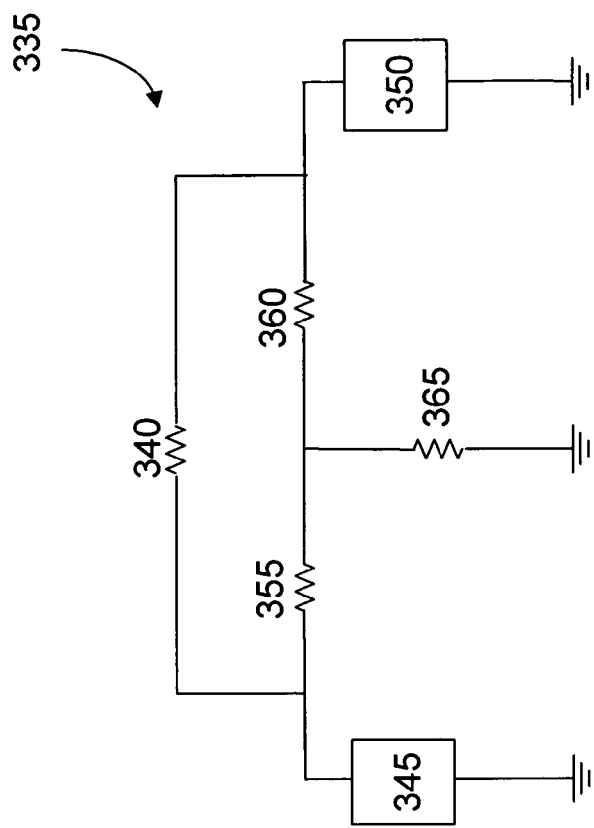
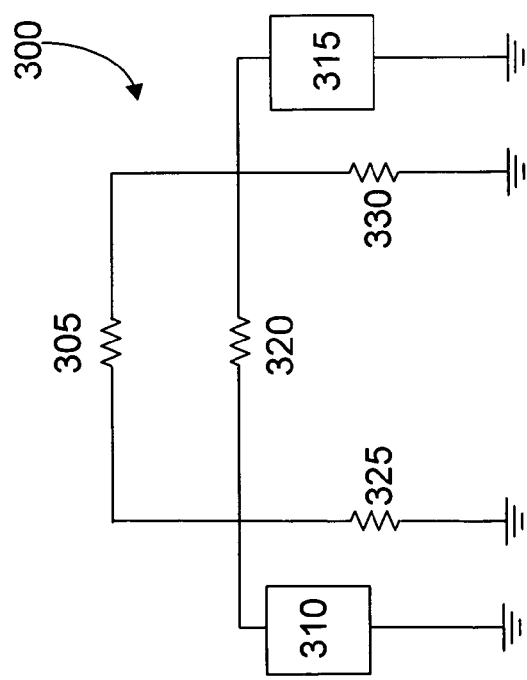
FIG. 3B (Prior Art)
FIG. 3A (Prior Art)

CIRCUITS AND METHODS OF THERMAL GAIN COMPENSATION

TECHNICAL FIELD

The present disclosure is generally related to signal conditioning, and more specifically to signal filtering.

BACKGROUND

Electrical signals can be used for the transmission and distribution of media signals, such as video and audio. The signals could incorporate, for example, Moving Picture Experts Group streams (i.e. MPEG-1, MPEG-2, MPEG-4 (i.e. H.264)), Windows® Media (VC-1) streams, RealAudio streams, or MPEG Audio Layer-3 (mp3) streams, among others that can be used for the transmission of audio and/or video signals in compressed digital streams. Accordingly, within the context of this disclosure, a signal could comprise one or more of an audio stream, a video stream, or any other underlying media signals used to convey information (text, graphics, animation, charts, graphs, etc.).

Such signals may be transmitted over a variety of distribution channels such as computer networks, satellite links, cable television (CATV) lines, radio-frequency signals, and digital subscriber lines (DSL), among others. As a consequence, the signals can be exposed to thermal conditions which may affect the operating parameters of the distribution channels. For example, a computer server may be housed within a warehouse in which the temperature may vary over 50 degrees C. between the maximum and minimum temperatures in one day. As another example, CATV equipment temperatures may reach 100 degrees C. Specifically, the gain of the transmitters and receivers of the data transmission equipment connected to the computer servers may vary due to the changes in temperature, which may cause the receivers and transmitters to operate outside of their specifications. The gain movement may be compensated by using a bridged T or a bridged Pi resistive network. However, these compensation networks result in a loss in gain margin.

Accordingly, in light of these potential deficiencies, among others, it is desirable to provide a transmitter or receiver that compensates for gain movement over temperature with little loss of gain margin.

BRIEF DESCRIPTION OF THE DRAWINGS

The components in the drawings are not necessarily to scale relative to each other. Like reference numerals designate corresponding parts throughout the several views.

FIG. 3A is a circuit diagram of a known thermal pad compensation circuit used within the cable television distribution network of FIG. 1.

FIG. 3B is a circuit diagram of a known thermal pad compensation circuit used within the cable television distribution network of FIG. 1.

DETAILED DESCRIPTION

Circuits and methods for temperature compensation of signals are disclosed. Embodiments of the systems can be scaleable to model different center frequencies, filter bandwidths and filter quality, while minimizing the loss of gain margin. An embodiment of the circuit includes a first terminal, a second terminal, a temperature compensation resistor, and a resonant filter for compensating for gain movement over temperature. The resonant filter can comprise a series resonant notch filter and a parallel resonant notch filter, among others.

Figure 1:
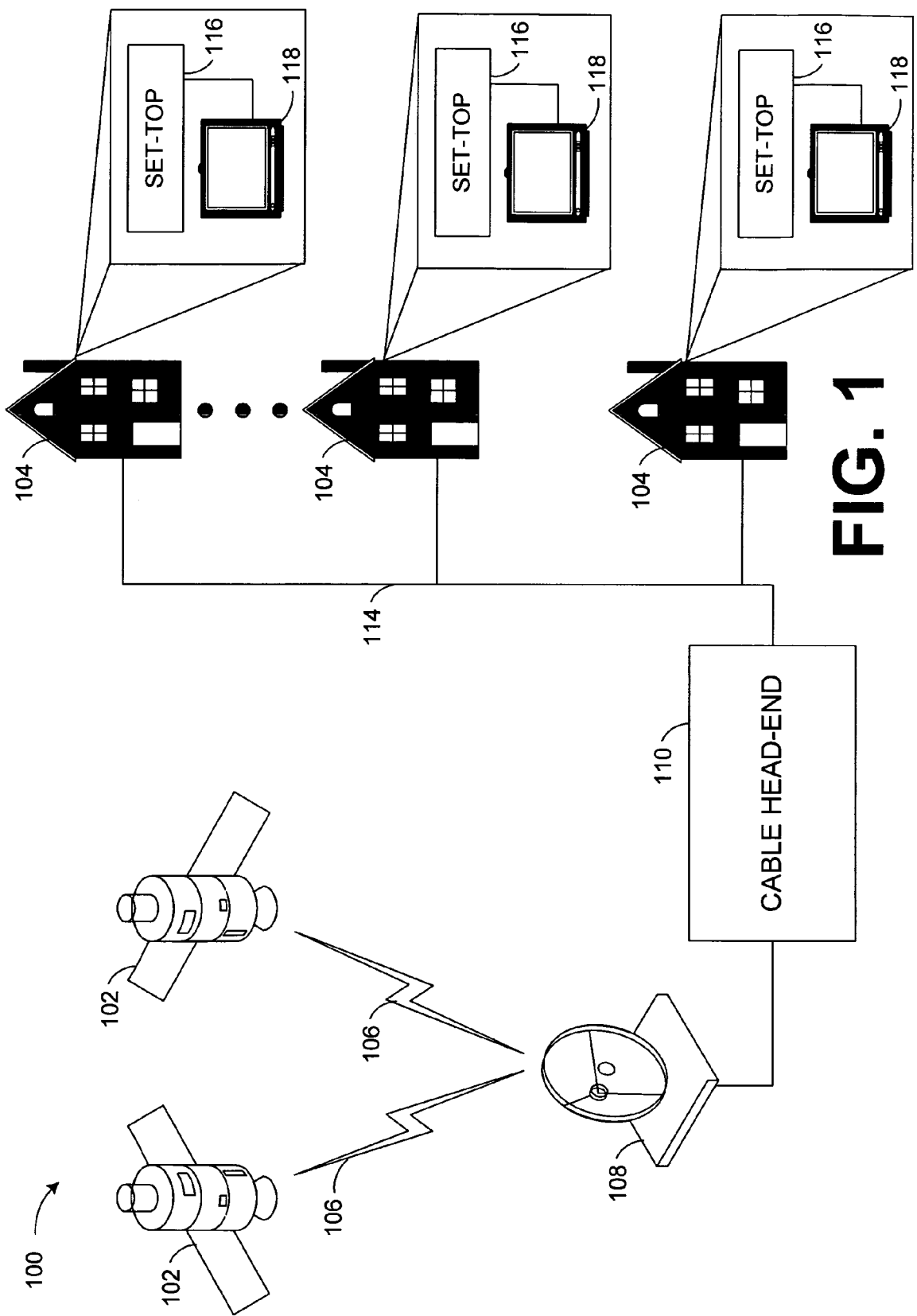
FIG. 1 depicts an exemplary embodiment of a cable television distribution network.

The described compensation circuits and methods could be used in a number of potential electronic systems. FIG. 1 depicts an embodiment of one particular electronic system, cable television distribution network 100, in which embodiments of the compensation circuits described herein may be used. In general, network 100 relays multimedia signals received from a number of sources, such as satellites 102, to a plurality of remote locations 104. Such multimedia signals could be, for example video and/or audio signals, which could also be transmitted with additional network data, including Internet traffic, teletext, closed-captioning, among others. The remote locations 104 could be residences or businesses that pay for, or otherwise receive, cable television programming. Although reference may be made generally to multimedia signals throughout the detailed description, signals having only one form of media, such as audio or video signals alone, are intended to be well within the scope of the disclosure.

Such multimedia signals and/or data signals may be transmitted over down-link 106 from satellites 102 to respective receiver 108 at cable head-end 110. The signals received at cable head-end 110 can be multiplexed data streams. Such data streams may comprise compressed multimedia streams transmitted in a variety of formats, such as, but not limited to, MPEG-1, MPEG-2, MPEG-4, VC-1, MP3, and/or RealAudio streams. Such compressed multimedia streams may be transmitted to cable head-end 110 at a variety of bit rates.

A thermal compensation circuit may be located at cable head-end 110 to compensate for thermally dependent gain fluctuations. That is, it is sometimes desired to compensate a gain block such that the gain margin of the gain block remains within system specifications. Such compensation may, for example, be driven by the available gain margin along connection 114 (i.e. between head-end 110 and remote locations 104), the requirements of set top box 116, and/or the type of playback device used at remote location 104.

The compensation circuit may, for example, include a notch filter in combination with a thermally reactive resistor for reducing gain fluctuations over temperature. Creating the gain block involves selecting resistive, capacitive, and inductive components to achieve flat gain response curves over the desired frequency band and over a specified temperature range.

The streams can be transmitted over communication connection 114 to one or more set top boxes 116 at remote location 104. Communication connection 114 may be, among others, a communications medium such as a coaxial cable, telephone line, or wireless connection. Set top box 116 can, for example, decode and extract the multimedia signals from the transcoded streams for playback on playback device 118. Playback device could be, for example, a television or audio playback system, a personal video recorder (PVR), a personal digital recorder (PDR), a personal computer, laptop computer, and/or personal digital assistant (PDA), among other electronic devices configured to execute media playback capabilities.

Set top box 116 could be, for example, in a cable television set-top box. According to other embodiments, set top box 116 could be associated with a television, stereo system, or computing device (e.g. personal computer, laptop, personal digital assistant (PDA), etc.), among others. Set top box 116 may receive a plurality of programs on a respective channel, each channel carried by a respective multimedia stream (which can include audio and video signals, among others).

Although the compensation circuit may be described in certain embodiments as being included in cable head-end 110, the compensation circuit could also be used in a number of other locations, such as in receiver 108. For example, according to such an embodiment, receiver 108 may be subject to temperature fluctuations leading to fluctuations in the gain response. These gain fluctuations may exceed system specifications for head end 110 to properly provide streams for device 118 for playback. Thus, receiver 108 may include a compensation circuit similar to the compensation circuit included in head-end 110 to reduce gain fluctuations due to temperature for head-end 110 or receiver 108.

Now that a number of potential non-limiting environments have been described within which the disclosed compensation circuits can be used, attention is now directed to various exemplary embodiments of such compensation circuits. When the temperature of an amplifier changes, the gain of the amplifier may change. A thermal compensation circuit counteracts the gain of the amplifier over temperature changes to maintain the signal within system specifications. One particular application, among others, in which this would be useful is within head-end 110, in which a signal is converted from a fiber-optic signal to an RF signal.

Figure 2:
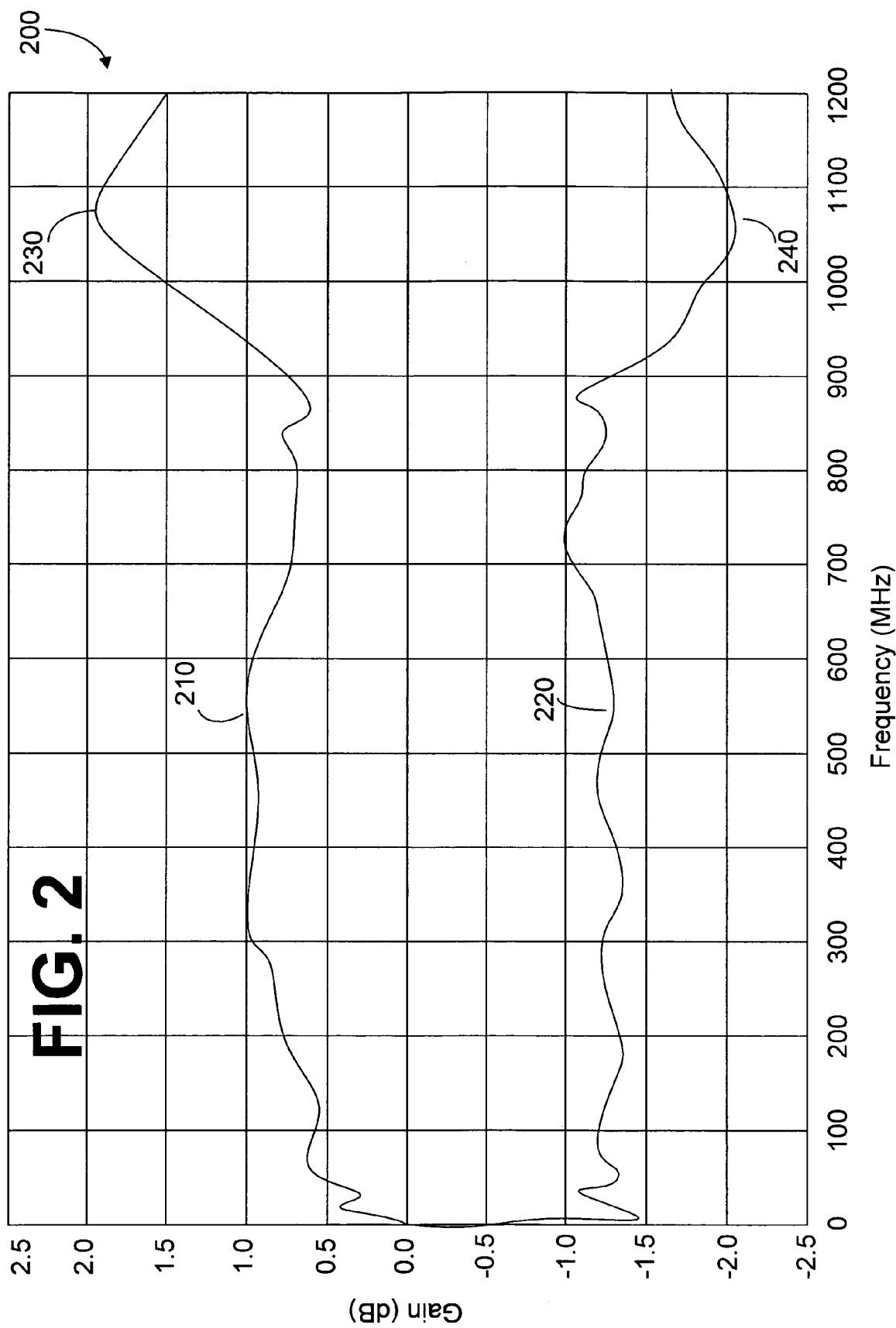
FIG. 2 is a graph of responsivity of gain to temperature of an element in the cable television distribution network of FIG. 1.

The gain of a receiver will swing over temperature and over the frequency range of the receiver such as shown in FIG. 2. Graph 200 of FIG. 2 shows the gain of a receiver over frequency and temperature. When the temperature changes, the gain curve shifts. A shifted gain response due to an increase in temperature is shown with response curve 220 and a shifted gain response due to a decrease in temperature is shown with response curve 210. The maximum point of the cold gain swing is at point 230 and the maximum point of the hot gain swing is at point 240. When this change in gain due to temperature is compensated, gain margin is normally sacrificed.

FIGS. 3A and 3B provide schematic diagrams of temperature compensation circuits known in the art. FIG. 3A is a Pi network that includes thermal coefficient resistor 305. A thermal coefficient resistor may also be referred to as a thermistor. Thermistor 305 may have a negative thermal coefficient (NTC) or a positive thermal coefficient (PTC) depending on the desired relation of the resistance of the thermistor and the temperature of the thermistor. A PTC resistor is a resistor that exhibits a rise in resistance versus a rise in temperature. So when the temperature of a PTC resistor increases, the resistance of the PTC resistor increases. An NTC resistor, conversely, exhibits a decrease in resistance for an increase in temperature. When the temperature increases, the resistance of the thermistor decreases. The nature of the gain curve will determine whether a negative or a positive thermal coefficient resistor should be used. If the gain becomes higher when the temperature goes lower and the gain goes lower when the temperature goes higher, an NTC resistor is used for the thermistor. If the gain decreases when the temperature gets colder and the gain increases when the temperature is hotter, a PTC resistor is used for the thermistor. Resistors 320, 325, 330 and 305 are electrically connected between termination resistors 310 and 315. Resistors 325, 320, and 330 are configured in a Pi configuration, in parallel with resistor 305.

FIG. 3B presents a second resistor network configured as a bridge T network with thermistor 340 which may be either a negative or a positive thermal coefficient resistor. Thermistor 340 is connected in series between terminals 345 and 350. The T network of resistors 355, 360, and 365 are connected in series with terminals 345 and 350 and in parallel with thermistor 340. The circuits of FIGS. 3A and 3B provide thermal compensation, but at the sacrifice of gain margin.

Figure 4:
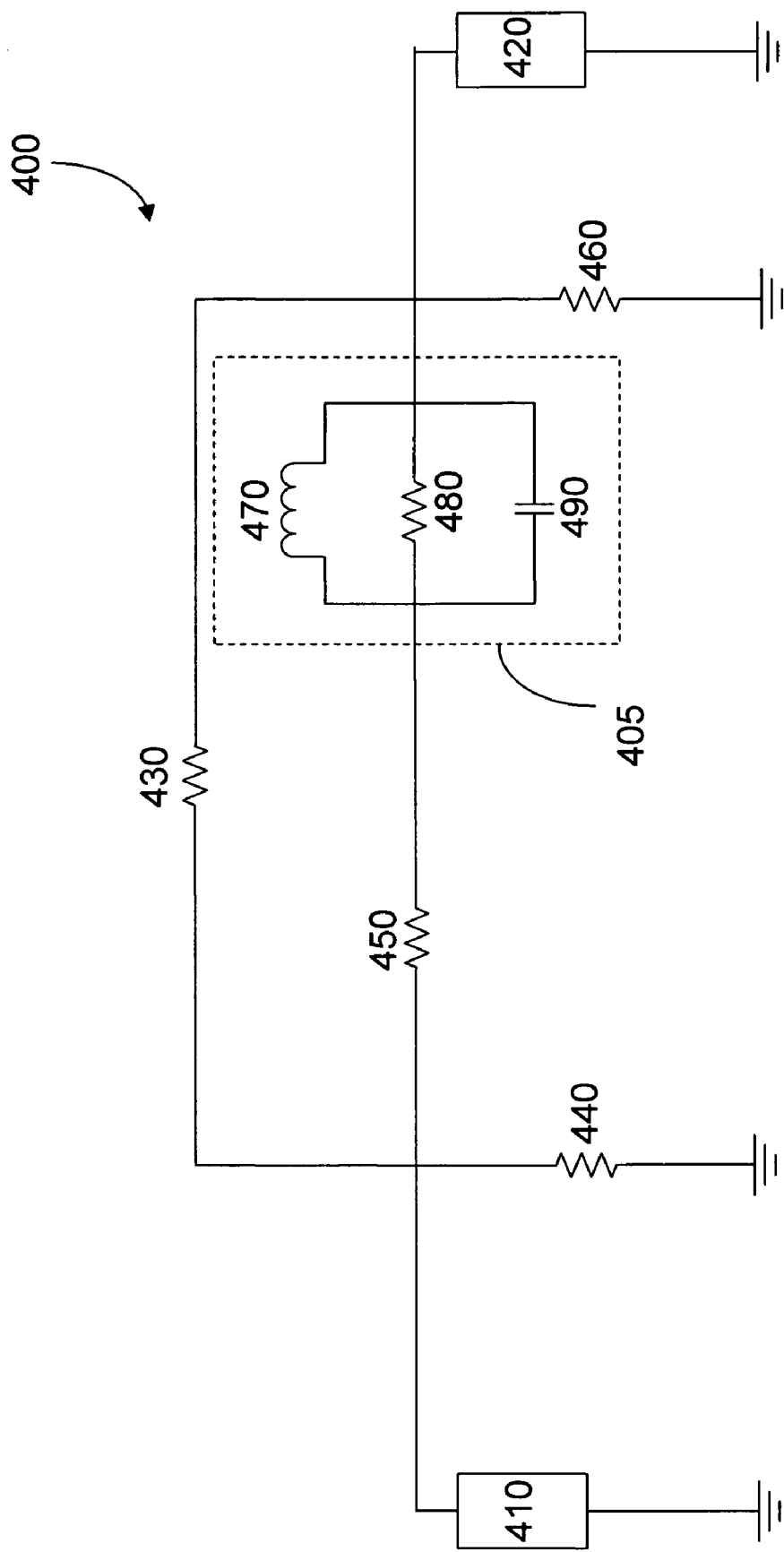
FIG. 4 is a circuit diagram of an exemplary embodiment of a thermal pad compensation circuit with substantially small loss of gain margin used within the cable television distribution network of FIG. 1.

To combat the loss of gain margin that occurs due to the circuits provided in FIGS. 3A and 3B, a resonant notch filter is utilized as provided in FIG. 4. There is a capacitive component to a photodiode used in head-end 110. This capacitive component resonates with an inductive component that amplifies the gain of the circuit and the response becomes flat. However, over a temperature change, the gain changes. One potential application for the temperature compensation network is a forward converter at the tip of the distribution network that is the fiber to the coax converter.

Again, thermistor 430 is electrically connected in series between termination resistors 410 and 420. Also, in series between termination resistors 410 and 420, a series connection of resistor 450 and a parallel resonant circuit comprising inductor 470, resistor 480, and capacitor 490 are electrically connected between termination resistors 410 and 420 and parallel with thermistor 430. Also, shunt resistor 440 is connected to termination resistor 410 and the series resistive network of resistors 430, 450, 480, and inductor 470 and capacitor 490. Likewise, shunt resistor 460 is connected between the resistive network and resistor 420. Resistors 440 and 460 are also connected to ground.

The circuits shown in FIGS. 3A and 3B will bring cold temperature gain response curve 210 of FIG. 2 and the hot temperature gain response curve 220 of FIG. 2 closer to the 0 dB line. However, the large gain wag at point 230 and point 240 will still be present. This wag at point 230 and point 240 can be greatly decreased by adding the resonant notch filter 405 as shown in FIG. 4. Resonant notch filter 405 comprises inductor 470, resistor 480, and capacitor 490. The value of the resistor 480 affects the height of the peak at point 230 and the valley at point 240 of FIG. 2 by attenuating the gain. An increase in the value of resistor 480 decreases the gain. In at least one exemplary embodiment, the value of resistor 480 is selected such that the gain curve is substantially flat. The ratio of the capacitor to the inductor defines the quality of the circuit where the center frequency of the notch filter equals $$\frac{1}{2\pi\sqrt{LC}}$$

and the quality Q of the circuit equals $$\frac{L\omega}{R}.$$

According to some embodiments, termination resistors 410 and 420 may have a characteristic impedance of 75 ohms for example.

In an exemplary embodiment, if an RF signal is transmitted over a frequency band with a particular gain limit, and circuits such as those provided in FIGS. 3A and 3B are added for compensation, gain margin may be reduced. The value of the components of the parallel resonant notch filter are dictated by the resonant frequency of the gain bulge that is to be filtered. The bulge of FIG. 2, for example, occurs between 900 MHz and 1200 MHz. In some exemplary embodiments, the values of capacitor 490 and inductor 470 are chosen the ratio of capacitor 490 and inductor 470 is equal to $$\frac{1}{2\pi\sqrt{LC}}.$$

The gain bulge may occur due to the effects of the photodiode used in the embodiment of head-end 110 (a fiber-optic receiver, which corresponds to an optical receiver at the head-end 110 illustrated in FIG. 1, uses a photodiode to convert a fiber-optic signal to an RF signal). The ratio of resistor 450 to thermistor 430 affects the gain compensation ratio across the frequency band of the transmitted signal. Whereas a notch filter, such as the parallel notch filter 405 of FIG. 4, amplifies the effect of the thermistor, at resonant frequency, capacitor 490 and inductor 470 cancel each other out. Accordingly, the parallel notch filter 405 can be implemented in the headend 110 (e.g., at the optical receiver). In such a situation, signals from the photodiode in the headend 110 (e.g., the optical receiver) can be input into the compensation circuit 400 at the terminal resistor 410, such that a compensated signal can be output at the terminating resistor 420 for further processing. As a person of ordinary skill in the art would understand, a capacitor has an impedance with an imaginary component of $-j\omega$, and an inductor has an impedance with an imaginary component of $+j\omega$. At resonant frequency $\omega$, $-j\omega$ and $+j\omega$ are 180 degrees out of phase and cancel each other out. So, at the resonant frequency, only resistor 480 is active on the signal, leaving resistor 430 in parallel with resistors 450 and 480. At resonant frequency, a smaller value of resistor 480 leads to a thermistor 430 with a smaller effective resistance. As resistor 480 is increased, the effective resistance of thermistor 430 increases.

Figure 5:
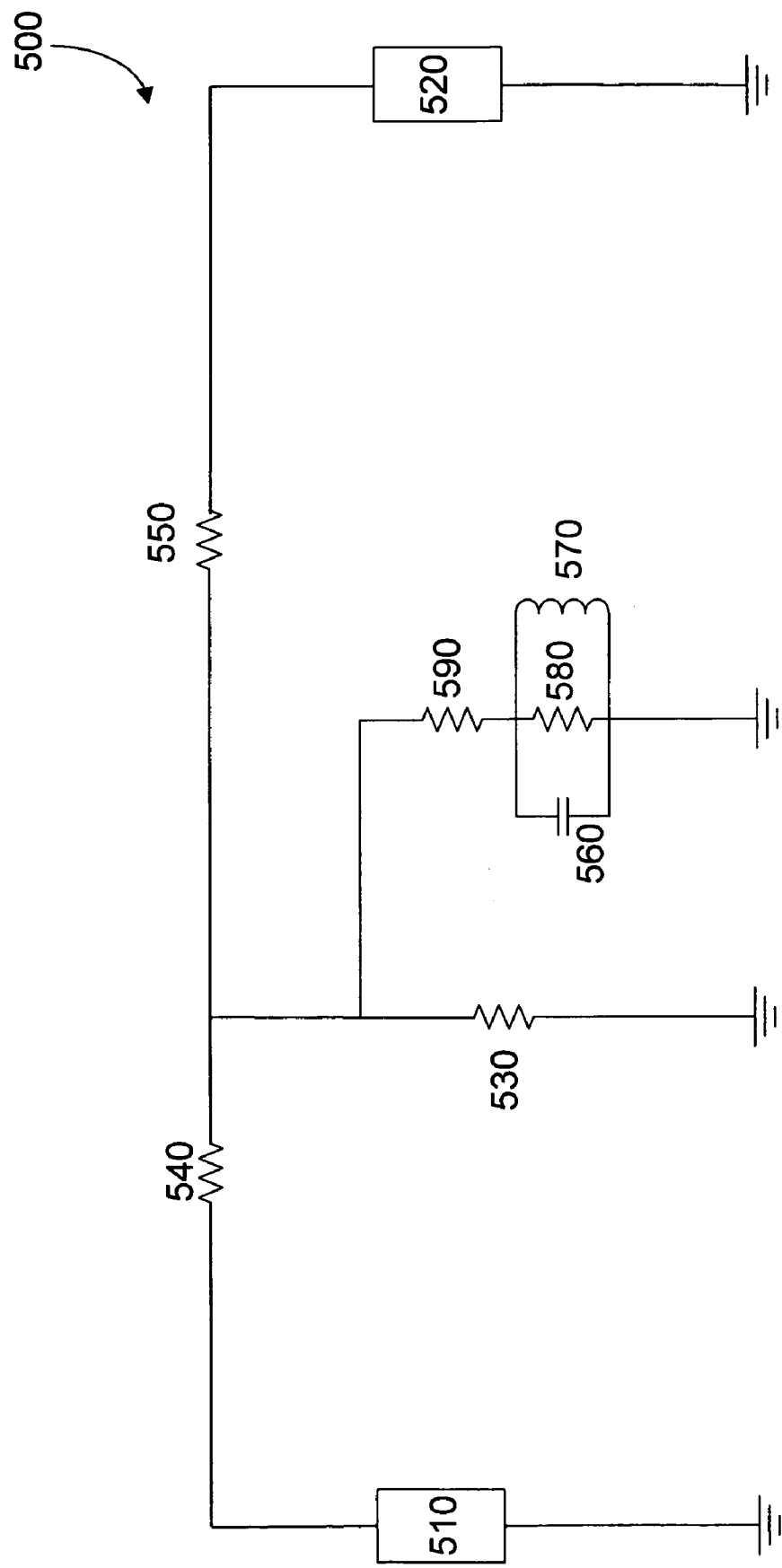
FIG. 5 is a circuit diagram of an alternative embodiment of a thermal pad compensation circuit with substantially small loss of gain margin that could be used within the cable television distribution network of FIG. 1.

In an alternative embodiment provided in FIG. 5, the notch filter, as well as the thermistor, may inserted in shunt with the signal path in conjunction with a thermal pad configuration. Again, thermistor 530 is electrically connected between termination resistors 510 and 520. Also, a series connection of resistor 540 and 550 is provided in series between termination resistors 510 and 520. A parallel resonant circuit comprising capacitor 560, resistor 580, and inductor 570 is electrically connected in series with resistor 590 and in parallel with thermistor 530. Thermistor 530 is also connected to ground. In order to obtain the same response as the circuit in FIG. 4, a PTC resistor is used in circuit 500.

As detailed previously, the circuits shown in FIGS. 3A and 3B will bring cold temperature gain response curve 210 of FIG. 2 and the hot temperature gain response curve 220 of FIG. 2 closer to the 0 dB line. However, the large gain wag at point 230 and point 240 will still be present. This wag at point 230 and point 240 can be greatly decreased by adding the resonant circuit as shown in FIG. 5.

The resonant notch filter comprises inductor 560, resistor 580, and capacitor 570. The value of the resistor 580 affects the height of the peak at point 230 and the valley at point 240 of FIG. 2. The ratio of the capacitor to the inductor defines the quality of the circuit where the center frequency of the notch filter equals $$\frac{1}{2\pi\sqrt{LC}}$$

and the quality Q of the circuit equals $$\frac{L\omega}{R}.$$

According to some embodiments, termination resistors 510 and 520 may have a characteristic impedance of 75 ohms, for example.

In order to compensate for a gain response with opposite gain characteristics from the graph in FIG. 2, a series resonant configuration may be used as shown in FIG. 5. The circuits provided herein may be utilized in a thermal pad of electronic devices or equipment such as the thermal pad of an integrated circuit, a printed circuit board, and a heat sink, among others.

Conditional language, such as, among others, "can," "could," "might," or "may," unless specifically stated otherwise, or otherwise understood within the context as used, is generally intended to convey that certain embodiments, among others, include, but do not require, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A circuit comprising:
   a first termination resistor;
   a second termination resistor;
   a temperature compensation resistor electrically connected in a first path between the first termination resistor and the second termination resistor; and
   a resonant notch filter electrically connected in a second path between the first termination resistor and the second termination resistor, the second path being electrically connected parallel to the first path that includes temperature compensation resistor, wherein the resonant notch filter comprises a resistor, a capacitor and an inductor.

2. The circuit of claim 1, wherein the temperature compensation resistor comprises a negative temperature coefficient resistor.

3. The circuit of claim 1, wherein the temperature compensation resistor comprises a positive temperature coefficient resistor.

4. The circuit of claim 1, wherein each of the resistor, the capacitor and the inductor of the resonant notch filter are connected in parallel.

5. The circuit of claim 1, wherein the circuit is included in a thermal pad.

6. The circuit of claim 1, wherein the circuit forms a portion of an optical receiver.

7. The circuit of claim 1, wherein the resistor of the resonant notch filter has a temperature coefficient of about zero.

8. A circuit comprising:
a first termination resistor;
a second termination resistor;
a temperature compensation resistor electrically connected between the first termination resistor and the second termination resistor; and
a resonant filter electrically connected between the first termination resistor and the second termination resistor and electrically connected parallel to the temperature compensation resistor, wherein the resonant filter comprises a notch filter with a center frequency substantially equal to $$\frac{1}{(2\pi\sqrt{LC})}$$

where L is the value of the inductor in Henrys and C is the value of the capacitor in farads, and with a Q value substantially equal to $$\frac{L\omega}{R},$$

where ω is the frequency in radians and R is the value of the resistor in ohms.

9. A method comprising:
receiving a signal in an optical receiver; and
filtering the signal with a resonant notch filter to substantially reduce a thermally dependent gain swing without substantially reducing the gain margin, wherein the resonant notch filter is electrically connected in a second path between a first termination resistor and a second termination resistor, and a second path connected between the first termination resistor and the second termination resistor includes the temperature compensation resistor, wherein the second path is electrically connected parallel to the first path, wherein the resonant notch filter comprises a resistor, a capacitor and an inductor.

10. The method of claim 9, wherein the temperature compensation resistor comprises a negative temperature coefficient resistor.

11. The method of claim 9, wherein the thermal coefficient resistor comprises a positive temperature coefficient resistor.

12. The method of claim 9, wherein each of the resistor, capacitor and inductor of the resonant notch filter is electrically connected in parallel.

13. The method of claim 9, wherein the resonant notch filter is included in a thermal pad.

14. The method of claim 9, wherein the method is performed in an optical receiver.

15. The method of claim 9, wherein the resistor of the resonant notch filter has a temperature coefficient of about zero.

16. A method comprising;
receiving a signal in an optical receiver; and
filtering signal to substantially reduce a thermally dependent gain swing without substantially reducing the gain margin, the resonant notch filter comprising a resistor, a capacitor and an inductor, the filtering being performed with a resonant notch filter electrically connected to and parallel with a temperature compensation resistor the;
wherein the resonant notch filter has a center frequency substantially equal to $$\frac{1}{(2\pi\sqrt{LC})}$$

where L is the value of the inductor in Henrys and C is the value of the capacitor in farads, and with a Q value substantially equal to $$\frac{L\omega}{R},$$

where ω is the frequency in radians and R is the value of the resistor in ohms.

* * * * *